United States Patent [19]

Scott

[11] 4,028,548

[45] June 7, 1977

[54] IR IMAGING WITH SURFACE WAVE READOUT

[75] Inventor: Marion L. Scott, Ridgecrest, Calif.

[73] Assignee: The United States of America as represented by the Secretary of the Navy, Washington, D.C.

[22] Filed: Mar. 29, 1976

[21] Appl. No.: 671,234

[52] U.S. Cl. .............................. 250/330; 250/338; 357/30

[51] Int. Cl.² .......................................... H01J 31/49

[58] Field of Search ................... 250/330, 332, 338; 357/30, 31

[56] References Cited

UNITED STATES PATENTS

| | | | |
|---|---|---|---|
| 3,808,435 | 4/1974 | Bate et al. | 250/332 |
| 3,842,274 | 10/1974 | Greene et al. | 250/330 |
| 3,846,820 | 11/1974 | Lampe et al. | 250/332 X |
| 3,919,555 | 11/1975 | Singer | 250/332 |

Primary Examiner—Davis L. Willis
Attorney, Agent, or Firm—R. S. Sciascia; Roy Miller

[57] ABSTRACT

A device for IR imaging with surface wave readout wherein RF signals are used to interrogate a depletion depth pattern of a doped pyroelectric material, the depletion depth pattern being a function of the IR energy detected. The RF signals set up an acoustic surface wave in a piezoelectric material in close proximity to the pyroelectric material, and the surface wave is modulated by the pattern. The surface wave is readout and used to modulate the intensity of a visual presentation for one line of the presentation, a two-dimensional visual image being obtained by proper sequential tracing.

8 Claims, 4 Drawing Figures

IR IMAGING WITH SURFACE WAVE READOUT

BACKGROUND OF THE INVENTION

The present invention relates to IR detection and imaging, and more particularly to IR imaging with acoustic surface wave readout.

A pyroelectric material is one that is characterized by the presence of a spontaneous polarization at room temperature with no applied electric field. This spontaneous polarization is a function of temperature with the pyroelectric coefficient, $p$, given by $$(P/dP = dT),\qquad(1)$$

where $P$ is the spontaneous polarization (charge density) on the material and $T$ is the temperature.

If the pyroelectric material is first doped with an appropriate impurity, such that a suitable carrier concentration, $n$, is achieved in the pyroelectric material, there will exist a depletion zone (absence of free charge carriers) at the surface. This depletion zone will be due to the presence of the surface charge repelling the free charge carriers from the surface. The depth of the depletion zone is a function of the surface charge density which is in turn a function of the temperature of the surface as indicated by equation (1).

SUMMARY OF THE INVENTION

Accordingly, the present invention provides a surface acoustic wave device of a piezoelectric material with sets of interdigital metallic transducers deposited on either end. This device is brought into close proximity to a pyroelectric material so that the electric field of a surface acousto wave propagating on the piezoelectric material will penetrate into the pyroelectric material. If a long signal pulse and a short scanning pulse are launched from opposite ends of the piezoelectric material, the two acoustic waves will interact through a non-linear coupling coefficient that is proportional to the depletion depth. The result is that the long pulse will be amplitde modulated by the depletion depth pattern (IR image) in the pyroelectric material. A two dimensional IR image is obtained by sequentially illuminating different portions of the image, using a mechanical scanner or scanning devices.

DESCRIPTION OF THE PREFERRED EMBODIMENT

Figure 1:
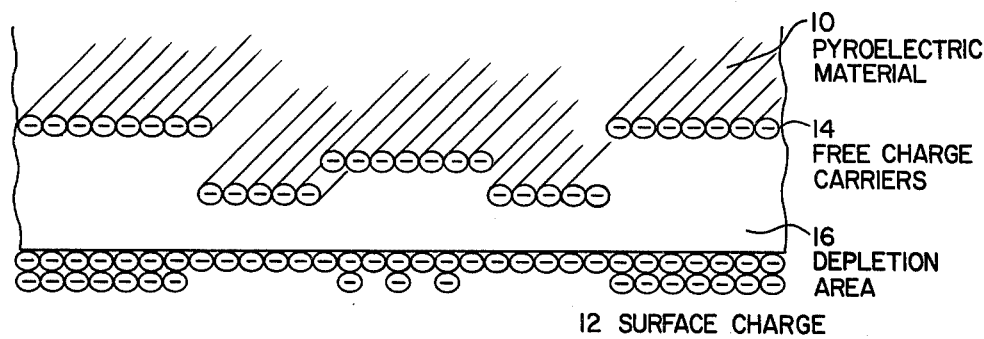
FIG. 1 is a cross-sectional view of a part of the pyroelectric material, illustrating the creation of a depletion area.

Referring now to FIG. 1, the stratum of pyroelectric material 10 develops a surface charge 12 which varies as a function of the temperature of the radiation incident thereon. The stratum 10 is doped with an impurity which produces an excess of free charge carriers 14. These free charge carriers 14 are repelled from the surface of the stratum 10 to create a depletion area 16, the depth of which is proportional to the temperature of the incident radiation. The depth of the depletion area 16 is then readout, as described hereinafter, to reproduce a line of an IR image either visually on a CRT screen, or by means of a digital display or a computer printout or plot.

Figure 2:
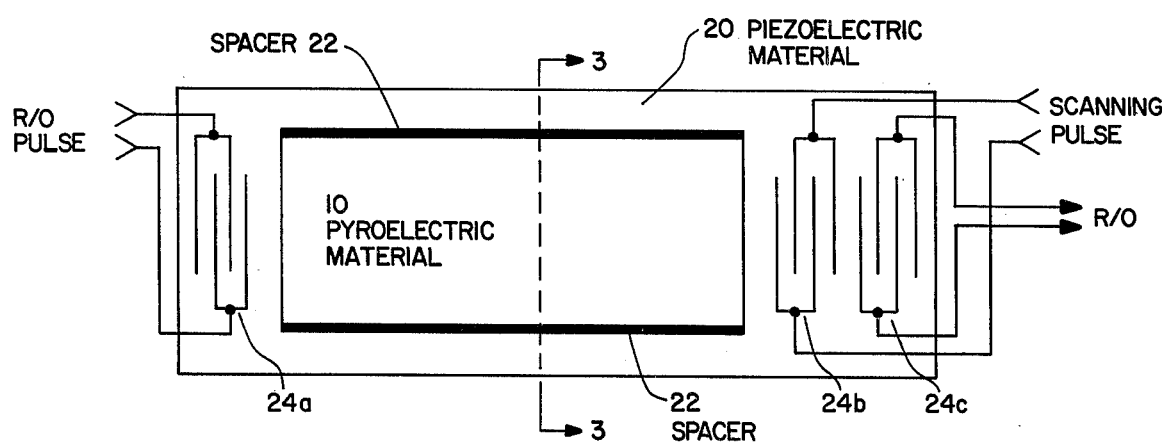
FIG. 2 is a plan view of the present invention.
Figure 3:
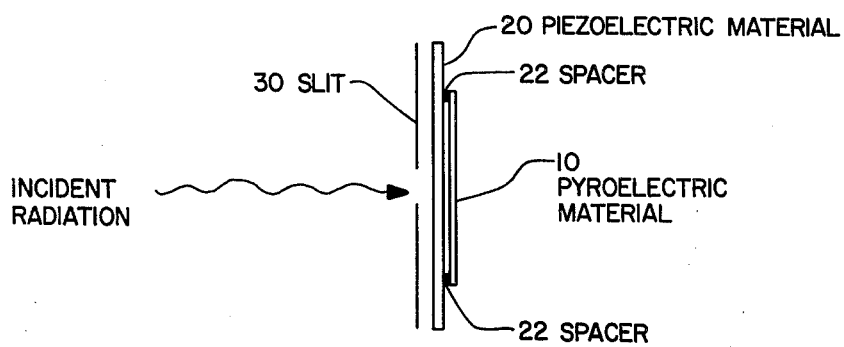
FIG. 3 is a cross-sectional view of the device of FIG. 2 taken along line 3—3.
Figure 4:
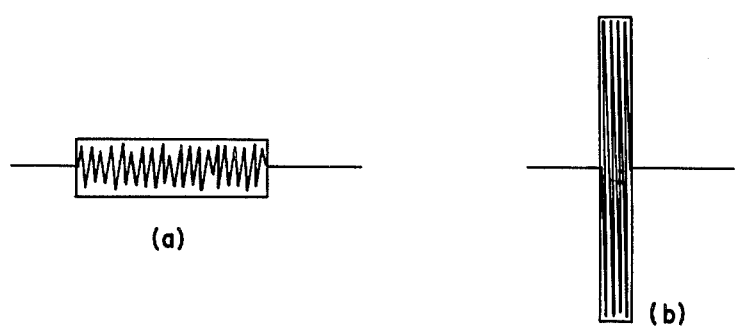
FIG. 4 represents (a) a readout pulse and (b) a scanning pulse.

FIG. 2 and FIG. 3 illustrate a particular embodiment of the present invention which reads the depth of the depletion layer 16. A substrate of piezoelectric material 20, such as lithium niobate, barium titannate, bismuth germanum oxide or the like, which is transparent to the wavelengths of incident radiation, is situated proximate to the pyroelectric material 10, separated therefrom by two spacers 22 of approximately 1000 A. Sets of interdigital metallic transducers 24 are deposited on either end of the piezoelectric substrate 20. One set of such interdigital metallic transducers 24 is used to input a readout pulse which produces a surface acoustic wave proprogating the length of the piezoelectric substrate 20 and which will penetrate into the pyroelectric stratum 10. Situated at the opposite end of the piezoelectric substrate 20 are the sets of interdigital metallic transducers 24 which act as a scanning pulse input transducer and a readout transducer, respectively. The spacers 22 are dielectrics, such as magnesium floride films, and run parallel to the direction of the propagation of the acoustic surface wave. Any pyroelectric material, such as lithium niobate, ceramic lead zerconium titinate or the like, may be used which has a high coupling coefficient into acoustic surface waves, but for dielectric matching it is preferred that the piezoelectric material and the pyroelectric material be the same.

The radiation from an IR image passes through a slit 30 and the piezoelectric substrate 20 to the pyroelectric stratum 10. Where the piezoelectric material and the pyroelectric are the same, a coating of black would be used on the surface of the pyroelectric material so that the incident radiation does not also pass though it. The black coating enhances the absorption of the incident radiation at the wavelength to which the pyroelectric material would ordinarily be transparent. The slit 30 narrows the line of incident radiation being scanned to provide greater resolution of the IR image. A long RF pulse is coupled to the piezoelectric substrate 20 through transducer 24a to create a surface acoustic wave which is propagated the length of the piezoelectric substrate to the readout transducer 24c having passed along the length of the pyroelectric stratum 10. The surface acoustic wave is attenuated by an amount which is proportional to the depth of the depletion area. Since all parts of the surface acoustic wave pass the length of the pyroelectric material 10 only the total attenuation of the wave is observed and the distributon pattern of the charge density would be unknown. Therefore, a scanning pulse of a high amplitude and short duration is input via the transducer 24b and propagates in opposition to the surface acoustic wave generated by the readout pulse. At the point at which the scanning pulse and the surface acoustic wave coincide, the surface wave is not attenuated by the depletion area which exists at that point. Thus, the surface acoustic wave is attenuated at all points by an amount equal to the total depletion area of the pyroelectric material minus that area which existed at the point where the scanning pulse and the surface wave coincided. A comparison of readout transducer 24c prior to the scanning pulse with the readout with the scanning pulse present shows a difference in attenuation which is caused at the specific location of the scanning pulse. The amplitude modulations of the IR signal on the pyroelectric stratum 10 can be observed due to the time relationship between the position of the scanning pulse and a position on the pyroelectric stratum 10.

If a pyroelectric stratum 10 is thin enough such that the electric field of the surface acoustic wave can penetrate completely through the stratum, then the radiation may be incident directly upon the pyroelectric material without passing first through the piezoelectric material, i.e., the readout would be from the backside rather than from the front side as described hereinabove. In this situation the piezoelectric material need not be transparent to the wavelength of the incident radiation. Obviously, many other modifications and variations of the present invention are possible in light of the above teachings. It is, therefore, to be understood that, within the scope of the appended claims, the invention may be practiced otherwise than as specifically described.

What is claimed is:

1. A device for IR imaging with surface wave readout comprising:

a pyroelectric stratum which is doped with an impurity to obtain a free carrier concentration in said stratum the free carriers being repelled from the surface of said stratum by a surface charge to form a depletion layer, the density of said surface charge being a function of the temperature of the incident radiation from an IR image;

a piezoelectric substrate parallel to the pyroelectric stratum and separated from it by spacers;

first means for propagating a first acoustic surface wave in the piezoelectric substrate, said wave transversing the substrate such that the electric field of the wave penetrates the pyroelectric stratum;

second means for propagating a second acoustic surface wave in the piezoelectric substrate, said second means located at the opposite end of the substrate from the first means so that second acoustic surface wave travels in the opposite direction from the first acoustic surface wave so as to amplitude modulate the first wave; and output means for observing the amplitude modulated first wave after it has transversed the pyroelectric stratum located at the same end of the piezoelectric substrate as the second propagating means.

2. The device for IR imaging with surface wave readout as described in claim 1 wherein:

the first acoustic surface wave is a long signal pulse; and the second acoustic surface wve is a short scanning pulse of sufficient energy to override the effect of the charge distribution in the depletion area of the pyroelectric stratum.

3. The device for IR imaging with surface wave readout as recited in claim 2 wherein said propagating means and said reading out means comprise interdigital transducers.

4. The device for IR imaging with surface wave readout as recited in claim 3 further comprising a dielectric spacer situated between said substrate and said stratum to provide separation, said spacer being oriented so as not to damp said surface acoustic waves.

5. The device for IR imaging with surface wave readout as recited in claim 4 further comprising a coating of black on said stratum to enhance the absorption of wavelengths which would not ordinarily be absorbed by the pyroelectric material of said stratum.

6. The device for IR imaging with surface wave readout as recited in claim 5 wherein said substrate comprises a piezoelectric material which is transparent to the wavelength of said incident radiation to allow said radiation to pass therethrough to said stratum.

7. A device for IR imaging with surface wave readout as recited in claim 6 further comprising means for sequentially scanning said image to produce a 2-dimensional IR image display.

8. The device for IR imaging with surface wave readout as recited in claim 7 further comprising a slit which is situated between said incident radiation and said substrate and stratum structure to increase the resolution of each line of said image.

* * * * *